United States Patent [19]

Zupancic et al.

[11] Patent Number: 4,786,700

[45] Date of Patent: Nov. 22, 1988

[54] HOMOGENEOUS THERMOSETTING COPOLYMERS

[75] Inventors: Joseph J. Zupancic, Bensenville; Andrew M. Zweig, Streamwood; James A. Wrezel, Buffalo Grove, all of Ill.

[73] Assignee: Allied-Signal, Inc., Morris Township, Morris County, N.J.

[21] Appl. No.: 947,590

[22] Filed: Dec. 30, 1986

[51] Int. Cl.$^4$ ............................................ C08F 216/12
[52] U.S. Cl. .................................. 526/292.9; 526/296; 526/309; 526/313
[58] Field of Search ................. 526/292.9, 296, 309, 526/313

[56] References Cited

U.S. PATENT DOCUMENTS 4,116,936  9/1978  Steiner ............................... 526/286

Primary Examiner—Christopher Henderson
Attorney, Agent, or Firm—Raymond H. Nelson; Harold N. Wells; Jay P. Friedenson

[57] ABSTRACT

Homogeneous thermosetting copolymers comprising a mixture of styrene-terminated tetrakisphenols and compounds containing at least one pendant vinyl group as exemplified by styrene-terminated tetrakisphenol ethane and styrene-terminated bisphenol A will possess desirable characteristics such as low dielectric constants and high glass transition temperatures. These polymers may be utilized as a component in laminates or circuit boards which are employed in relatively complicated pieces of electronic equipment.

20 Claims, No Drawings

HOMOGENEOUS THERMOSETTING COPOLYMERS

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix such as glass, quartz, graphite, Kevlar, etc.

As will hereinafter be shown, it has now been discovered that homogeneous thermosetting copolymers of a poly(vinyl benzyl ether) of a polyphenol, and a compound containing at least one pendant vinyl group may be used in the preparation of laminates which themselves will form a component of a circuit board and will possess the desirable characteristics hereinbefore set forth.

BRIEF SUMMARY OF THE INVENTION

This invention relates to homogeneous thermosetting copolymers. More specifically, the invention is concerned with novel high temperature homogeneous thermosetting copolymers and to a method for the preparation thereof. As was previously mentioned, the homogeneous thermosetting copolymers of the present invention, which constitute novel compositions of matter may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal propagation delay and line capacitance. This results in faster PWB circuitry and, in addition, provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mis-match of thermal expansions with the electronic components and the fiberglass reinforcement with which the polymeric matrix is composited. The coefficients of thermal expansion of the novel homogeneous thermosetting copolymers of the present invention are superior to that of a polyimide matrix. Furthermore, the thermal stability of the polymer matrix must be relatively high in nature inasmuch as the matrix must possess the ability to withstand soldering temperatures without melting or degrading. A desirable characteristic of the homogeneous thermosetting copolymer of the present invention is that the thermal stability of the polymer is comparable to a polyimide matrix.

It is therefore an object of this invention to provide novel homogeneous thermosetting copolymers.

Another object of this invention is to provide a method for preparing the aforesaid homogeneous thermosetting copolymers which are useful as components in the formulation of circuit board laminates.

In one aspect, an embodiment of this invention resides in a homogeneous thermosetting copolymer comprising a poly(vinyl benzyl ether) of a polyphenol having the generic formula:

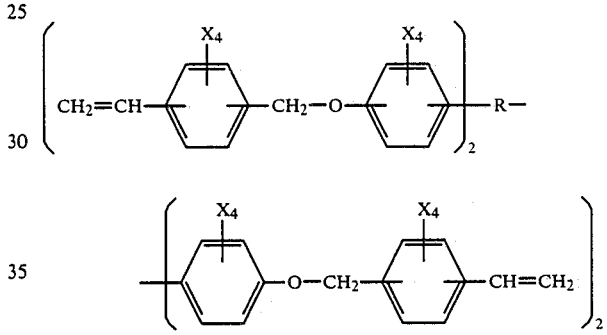

in which R is selected from the group consisting of alkyl, cycloalkyl, alkaryl and substituted alkaryl radicals and X is independently selected from the group consisting of hydrogen and halogen atoms and a compound containing at least one pendant vinyl group.

A specific embodiment of this invention is found in a homogeneous thermosetting copolymer comprising a mixture of styrene-terminated tetraphenol ethane resin and styrene-terminated p,p'-isopropylidene diphenol.

Other objects and embodiments will be found in the following further detailed description of this invention.

DETAILED DESCRIPTION OF THE INVENTION

As is hereinbefore set forth, the present invention is concerned with novel homogeneous thermosetting copolymers and to a method for the preparation of these copolymers. The homogeneous thermosetting copolymers will comprise a mixture of poly(vinyl benzyl ether) of a polyphenol and a compound containing at least one pendant vinyl group. The polymerization of these compounds will result in a copolymer which, because of its particular structure, will be useful in electronic circuitry inasmuch as the copolymer will possess relatively low dielectric constants, high glass transition temperatures, low coefficients of thermal expansion, and suitable flow viscosity. These systems are excellent candidates for continuous lamination, reinforcement reaction in an injection molding, composite reaction injection molding, or resin transfer molding applications.

The poly(vinyl benzyl ether) of a polyphenol which forms one component of the copolymer of the present invention will possess the generic structure:

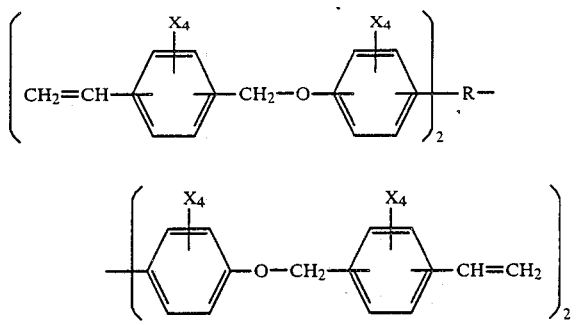

in which R is selected from the group consisting of alkyl, cycloalkyl, alkaryl and substituted alkaryl radicals and X is independently selected from the group consisting of hydrogen and halogen atoms and a compound containing at least one pendant vinyl group. In the preferred embodiment of the invention, the alkyl radical will contain from about 2 to about 6 carbon atoms and the cycloalkyl radical will contain from about 4 to about 12 carbon atoms.

These compounds may be prepared by reacting a tetraphenol alkane, tetraphenol aromatic, tetraphenol cycloalkane or a tetraphenol-substituted cycloalkane compound with a vinyl benzyl halide such as vinyl benzyl chloride at reaction conditions to form the desired product, namely a styrene-terminated tetrakisphenol. The reaction conditions which are employed to effect the desired condensation will include temperatures ranging from about 60° to about 70° C. and preferably the reflux temperature for a period of time which may range from about 1 to about 4 hours in duration. After maintaining the reaction mixture at the desired temperature, a basic solution in an alcoholic medium may then be added and reflux continued. Upon completion of the desired reflux time, the reaction mixture may then be diluted with an organic solvent and allowed to remain at ambient temperature for a second predetermined period of time. Following this, the reaction mixture may be recovered and the desired product separated by conventional means from any unreacted starting material solvent, etc. to form the desired monomer.

Specific examples of tetraphenol compounds which may be employed as starting materials and condensed with the vinyl benzyl halide such as vinyl benzyl chloride may include:
1,1,2,2-tetrakis(hydroxyphenyl)ethane;
1,1,3,3-tetrakis(hydroxyphenyl)propane;
1,1,4,4-tetrakis(hydroxyphenyl)butane;
1,1,5,5-tetrakis(hydroxyphenyl)pentane;
1,1,6,6-tetrakis(hydroxyphenyl)hexane;
1,1,3,3-tetrakis(hydroxyphenyl)cyclobutane;
1,1,3,3-tetrakis(hydroxyphenyl)cyclopentane;
1,1,4,4-tetrakis(hydroxyphenyl)cyclohexane;
1,1,4,4-tetrakis(hydroxyphenyl)cyclooctane;
1,1,5,5-tetrakis(hydroxyphenyl)cyclooctane;
1,1,4,4-tetrakis(hydroxyphenyl)m-xylene;
1,1,4,4-tetrakis(hydroxyphenyl)p-xylene; etc. and oligomers of these compounds.

It is to be understood that the aforementioned tetraphenol compounds are only representative of the class of compounds which may be employed as one of the components in the formation of the poly(vinyl benzyl ether) of a polyphenol and that the present invention is not necessarily limited thereto.

The second component of the copolymer of the present invention will comprise a compound containing at least one pendant vinyl group and may be either aromatic or aliphatic in nature. Some specific examples of the compounds which may be employed as a copolymer in the present invention will include: styrene, o-divinylbenzene, m-divinylbenzene, p-divinylbenzene, substituted styrenes and divinylbenzenes such as o-vinyltoluene, m-vinyltoluene, p-vinyltoluene, o-chlorostyrene, m-chlorostyrene, p-chlorostyrene, o-bromostyrene, m-bromostyrene, p-bromostyrene, dichlorostyrene, trichlorostyrene, tetrachlorostyrene, dibromostyrene, tribromostyrene, tetrabromostyrene, o-chloromethylstyrene, m-chloromethylstyrene, p-chloromethylstyrene, o-bromomethylstyrene, m-bromomethylstyrene, p-bromomethylstyrene, o-ethylstyrene, m-ethylstyrene, p-ethylstyrene, o-propylstyrene, m-propylstyrene, p-propylstyrene, 2-chloro-p-divinylbenzene, 2-bromo-p-divinylbenzene, 2,5-dichloro-p-divinylbenzene, 2,5-dibromo-p-divinylbenzene, 2,3,5,6-tetrachloro-p-divinylbenzene, 2,3,5,6-tetrabromo-p-divinylbenzene, bismaleimides such as 1,1'-(methylene di-4,1-phenylene)-bismaleimide or bismaleimide resins derived from it by reaction with aryldiamines (methylene dianiline, etc.), styrene-terminated bisphenols such as styrenated p,p'-methylidene diphenol, styrenated p,p'-ethylidene diphenol, styrenated p,p'-n-propylidene diphenol, styrenated p,p'-isopropylidene diphenol, styrenated p,p'-biphenol, dihydroxydiphenyl sulfone, dihydroxybenzophenone, thiodiphenol, oxydiphenol, tetramethyl-p,p'-isopropylidene diphenol, 3,3',5,5'-tetramethyl-4,4'-biphenol, methyl acrylate, ethyl acrylate, propyl acrylate, methyl methacrylate, ethyl methacrylate, propyl methacrylate, etc. It is to be understood that aforementioned list of components of the copolymers of the present invention including the poly(vinyl benzyl ether) of a polyphenol and the compounds containing at least one pendant vinyl group are only representative of the type of compounds which may be employed and that the present invention is not necessarily limited thereto.

The novel homogeneous thermosetting copolymers of the present invention may be prepared in any suitable manner of operation which is known in the art. For example, one method of obtaining the desired copolymer is to blend the poly(vinyl benzyl ether) of a polyphenol with a compound containing at least one pendant vinyl group in a mutually miscible solvent to form a homogeneous pourable solution at ambient temperature. Examples of mutually miscible solvents which may be employed to form the desired solution will include chloroform, acetone, aromatic solvents such as benzene, toluene, the isomeric xylenes or aprotic solvents such as N,N-dimethylformamide or N-methylpyrrolidinone. While, in the preferred embodiment of the invention, the blending is effected at ambient temperatures, it is also contemplated that elevated temperatures ranging from about 50° to about 150° C. may also be employed to form the desired solution.

If so desired, the resulting blend may then be subjected to a curing cycle in which the solution is heated to remove a substantial or major portion of the solvent. Following this, the blend is then subjected to a curing cycle by heating the blend to a temperature in the range of from about 160° to about 200° C. for a period of time which may range from about 4 to about 20 hours or more in duration. Following this cure cycle, the sample may be post-cured if desired at a temperature of about 225° C. for an additional period of time and recovered. The cured homogeneous thermosetting copolymer may then be utilized as a component in forming a laminate. For example, the copolymer which has been blended and subsequently cured according to the process hereinbefore set forth may be used in a resin casting operation. This operation is effected by dissolving the components in a suitable solvent of the type also hereinbefore set forth and the resulting solution then used to impregnate a suitable filler or reinforcement such as fiberglass, cloth, Kevlar, graphite, alumina, quartz, ceramic, etc. to form a laminate ply or "prepreg" after removal of a major portion of solvent. The laminate may then be used as a single ply or a predetermined number of plies which may be pressed into a number of sheets to form the desired circuit board matrix.

Alternatively, the homogeneous solution of the blend which is fluid at ambient temperature may then be poured onto a cloth reinforcement, injected into a mold containing a cloth reinforcement, or mixed with a reinforcement matrix (i.e. powder, fibers, whiskers, etc.) by various processes including composite reaction injection molding, reinforced reaction injection molding, or resin transfer molding, and cured at an elevated temperature in the range of from about 80° C. to about the boiling point of the alkenyl aryl compounds for a period of time which may range from about 0.002 to about 1 hour. Thereafter, the treated reinforcement may then be transferred to a separate heating press or oven, following which it may be further cured at a temperature ranging from about 150° to about 200° C. for a period of time which may range from about 1 to about 12 hours in duration. The processes may also involve having copper-plated caul plates or copper sheets inserted into the mold cavity; said copper substrate having been treated with another metal and/or may be coated with a varnish which may be partially or fully cured after the coating. Alternatively, the copper-plated caul plates or copper sheets may also be coated with partially or fully cured resin-containing metallic particles such as palladium-tin, or an intermediate carrier may be coated with the filled varnish which would then be placed on the caul plate or copper sheet prior to resin injection. This filled coating may, if so desired, take the place of the plated copper or copper sheet.

It is also contemplated within the scope of this invention that the homogeneous solution may also be blended with particular fillers and may then be poured into a mold or utilized in various other ways such as incapsulating a chip or forming a chip carrier.

Alternatively, the homogeneous thermosetting copolymers may be prepared and utilized as hereinbefore set forth in a continuous manner of operation. When this type of operation is employed, predetermined amounts of the poly(vinyl benzyl ether) of a polyphenol and a compound containing at least one pendant vinyl group are continuously charged while dissolved in an appropriate solvent either separately or in a premixed state to a zone which is maintained at the proper operating conditions of temperature and pressure.

After passage through this zone, the mixture resulting therefrom may be continuously withdrawn and utilized to coat and/or impregnate a substrate or reinforcement. The coated or impregnated substrate or reinforcement may thereafter be continuously charged to a heating zone where it is subjected to conditions suitable for removal of a major portion of solvent and/or partial cure by passage through this zone which is maintained at varying operating temperatures for a predetermined period of time. After passage through the zone, the resulting prepreg material is continuously withdrawn and passed to storage. The prepreg can then be layed up as sheets with or without a metal such as copper foil as an electrical or thermal conductor, and pressed with a predetermined number of sheets to form the desired laminate or circuit board matrix. The said prepreg may be recoated with varnish just prior to layup and subsequent lamination. Alternatively, the prepreg may be reocated with the polymer in a step just prior to layup, followed by subsequent lamination.

Inasmuch as the amounts of each component will be dependent upon the particular application to which the finished copolymer is to be employed, these amounts will vary over a relatively wide range. For example, the two components of the desired copolymer may be present in the mixture in amounts ranging from about 0.01% to about 99.9% by weight of the poly(vinyl benzyl ether) of a polyphenol and from about 99.9% to about 0.01% of the compound containing at least one pendant vinyl group. By varying the weight percentage of the two components of the homogeneous thermosetting copolymer, it is possible to alter and control the viscosity of the mixture.

In addition to the aforementioned favorable characteristics which are possessed by the homogeneous thermosetting copolymer of the present invention, another advantage in utilizing these copolymers as components of a laminate is when employing a halogenated derivative of the poly(vinyl benzyl ether) of a polyphenol with the halogenated derivative of the compound containing at least one pendant vinyl group. The function of these halogenated derivatives, and especially the brominated or chlorinated derivatives, will be to introduce the desired property enhancement to the laminate such that the laminate may then meet certain flammability requirements such as UL 94 flammability tests.

The following examples are given for purposes of illustrating the novel homogeneous thermosetting copolymers of the present invention which possess the aforementioned desirable properties and to a method for preparing these copolymers. However, it is to be understood that these examples are given merely for purposes of illustration and that the present invention is not necessarily limited thereto.

EXAMPLE I

In this example, 100 grams (0.142 mole) of commercial grade 1,1,2,2-tetraphenol ethane and 166.54 grams (1.091 moles) of vinyl benzyl chloride (60/40 meta/para isomer ratio) were dissolved in 250 milliliters of acetone in a three neck-round bottom flask which was equipped with a condenser, addition funnel, thermometer, mechanical stirrer, and nitrogen purge. The reaction mixture was then heated to reflux (65°-70° C. temperature) for a period of one hour, following which a solution of 67.5 grams (1.202 moles) of potassium hydroxide in 150 milliliters of methanol was added to the warm reaction mixture over an interval of 30 minutes with continuous stirring. The reaction mixture was maintained at reflux temperature for a period of 1 hour, thereafter diluted with 400 milliliters of acetone and was then stirred at ambient temperature for a period of 24 hours. The reaction mixture was recovered, dried gave the following results which are set forth in Table 2 below:

TABLE 2

| STTPE wt (g) | STTBBPA wt (g) | DSC Glass Transition | a'260 (ppm/°C.) Coefficient of Thermal Expansivity | | Dielectric[a] Constant | Dissipation[a] Factor |
|---|---|---|---|---|---|---|
| 1.50 | 0.50 | >300° C. | 51 ± 2 | 0% RH | 2.87 ± 0.04 | 0.009 ± 0.003 |
|  |  |  |  | 50% RH | 3.07 ± 0.03 | 0.009 ± 0.001 |
| 1.00 | 1.00 | >300° C. | 40 ± 12 | 0% RH | 2.98 ± 0.11 | 0.006 ± 0.001 |
|  |  |  |  | 50% RH | 3.09 ± 0.01 | 0.010 ± 0.001 |
| 0.50 | 1.50 | >300° C. | 53 ± 1 | 0% RH | 2.91 ± 0.09 | 0.006 ± 0.001 |
|  |  |  |  | 50% RH | 2.99 ± 0.03 | 0.007 ± 0.001 |

[a] 1 MHz, 0% RH, 25° C.

over magnesium sulfate, filtered, and concentrated under vacuum. The oil was then taken up in an equal volume of acetone and precipitated from the acetone solution by the addition of methanol. The resulting solid was vacuum dried at ambient temperature for a period of 24 hours to yield 87.0 grams of a yellow crystalline material having a melting point of 52° C.; a $\overline{M}n$ (number-average molecular weight) of 1.088 K, a $\overline{M}w$ (weight-average molecular weight) of 5.080 K and R (dispersity index) of 4.67. In addition, the material had a viscosity of 50 cps (50% solids, dimethylformamide, 23° C.). In addition, elemental analysis disclosed 84.40% carbon, 5.94% hydrogen, and 8.81% oxygen.

EXAMPLE II

A polymer blend was prepared by admixing 1.00 gram of the styrene-terminated tetrakisphenol ethane resin prepared according to the above paragraph and 1.00 gram of styrene-terminated bisphenol A in 10 milliliters of chloroform. The resulting blend was then cured by first removing a major portion of the chloroform solvent, heating in an oven at a temperature of 120° C. for a period of 3 hours, followed by a 16-hour cure at a temperature of 160° C. and a 2-hour cure at a temperature of 200° C. Following this, the sample was then post-cured for a period of 1 hour at 225° C. and recovered. The cured polymer was found to have a glass transition temperature (Tg) of greater than 300° C., a coefficient of thermal expansivity from 25° to 260° C. of 48±4 ppm/°C. The polymer was also tested for dielectric constant and dissipation factor at 0% relative humidity and 50% relative humidity with the following results:

TABLE 1

|  | Dielectric Constant | Dissipation Factor at 1 MHz |
|---|---|---|
| 0% Relative Humidity | 2.71 ± 0.07 | 0.007 ± 0.001 |
| 50% Relative Humidity | 2.74 ± 0.05 | 0.008 ± 0.000 |

EXAMPLE III

In this example, various polymer blends were prepared utilizing varying ratios of styrene-terminated tetrakisphenol ethane (STTPE) resin prepared according to Example I above and styrene-terminated tetra-bromo-substituted bisphenol A (STTBBPA). The polymer blends were cured in a manner similar to that set forth in Example II above, that is, by heating to a temperature of 120° C. for a period of 2 hours, 160° C. for 16 hours, 200° C. for 2 hours, and a post-cure at a temperature of 225° C. for 1 hour. Analyses of these blends

EXAMPLE IV

To form a halogen-substituted compound, 100.65 grams (0.143 mole) of commercial grade 1,1,2,2-tetraphenol ethane, 100 milliliters of carbon tetrachloride and 230 milliliters of methanol were placed in a 1000 milliliter round bottom, three-necked flask. The flask was equipped with a coarse sparge tube, an addition funnel, condenser, stirring bar, and oil bubbler outlet. Potassium bromide in an amount of 5.0 grams (0.042 mole) was added to the flask which was then heated to a temperature of from 45° to 55° C. by means of a water bath and sparged with nitrogen for 20 minutes. Thereafter 103.5 milliliters (321.1 grams, 2.01 moles) of bromine was added to the warmed reaction mixture with stirring during a period of 4 hours. At the end of this time, 200 milliliters of water was added to the reaction mixture and the volatile products were distilled off at atmospheric pressure. The remaining residue was taken up in 400 milliliters of methylene chloride and the organic phase was washed three times with 200 milliliters of water, the third wash being effected at a pH of 5. The organic phase was then washed twice with 200 milliliters of a 10% aqueous sodium bisulfite solution to remove any residual bromine which may still have been present. After the wash with the sodium bisulfite solution, the organic phase was again washed with 200 milliliters of water and dried over sodium sulfate. The methylene chloride was removed under vacuum to afford a burgundy-colored crystalline solid. Azeotropic drying with ethanol gave 152.23 grams of polybromotetraphenol ethane. Elemental analysis of the product found C=34.19%, H=2.00%, Br=55.03%, and O=8.86%.

The desired monomer was prepared by charging 49.89 grams ($2.655 \times 10^{-2}$ moles) of the polybromotetraphenol ethane, 35.5 grams ($2.325 \times 10^{-1}$ moles) of vinyl benzyl chloride and 197.5 milliliters of acetone to 1 liter, 3 necked flask equipped with a condenser, additional funnel, thermometer, nitrogen purge and magnetic stirring bar. The solution was stirred for a period of 30 minutes at 25° C. and thereafter refluxed for a period of 1 hour. Following this, a solution of 12.51 grams ($2.23 \times 10^{-1}$ moles) of potassium hydroxide in 30 milliliters of methanol was added to the reaction mixture during an interval of 30 minutes with continuous stirring. Upon completion of the addition of sodium hydroxide, the stirred mixture was refluxed for a period of 1 hour and thereafter stirred at ambient temperature for an additional period of 16 hours. The crude reaction mixture was dried over magnesium sulfate, filtered and concentrated under vacuum. The resulting crude oil was taken up in 60 milliliters of acetone and precipitated from the acetone solution by the addition of 3000 milliliters of methanol. The resin was vacuum dried at ambient temperature for a period of 16 hours to yield 12.74 grams of a tan crystalline material comprising styrene-terminated polybrominated tetraphenol ethane.

EXAMPLE V

In this example, polymer blends of the styrene-terminated tetrakisphenol (STTPE) prepared according to Example I above and styrene-terminated bromo-substituted tetrakisphenol ethane (STBTPE) were prepared utilizing the curing procedure hereinbefore set forth in the above examples. Analysis of these blends disclosed the following properties which are set forth in Table 3 below.

TABLE 3

| | | | PROPERTIES | | |
|---|---|---|---|---|---|
| STTPE wt (g) | STBTPE wt (g) | DSC Glass Transition | a'260 (ppm/°C.$^{-2}$) Coefficient of Thermal Expansivity | Dielectric$^a$ Constant | Dissipation$^a$ Factor |
| 1.00 | 1.00 | >300° C. | 55 ± 1 | 0% RH 3.05 ± 0.01 | 0.006 ± 0.001 |
| | | | | 50% RH 3.18 ± 0.05 | 0.011 ± 0.001 |
| 1.50 | 0.50 | >300° C. | 74 ± 4 | 0% RH 3.44 ± 0.03 | 0.005 ± 0.001 |
| | | | | 50% RH 3.53 ± 0.03 | 0.008 ± 0.001 |

$^a$1 MHz, 25° C.

We claim as our invention:

1. A homogeneous thermosetting copolymer comprising (a) a poly(vinyl benzyl ether) of a polyphenol having the generic formula:

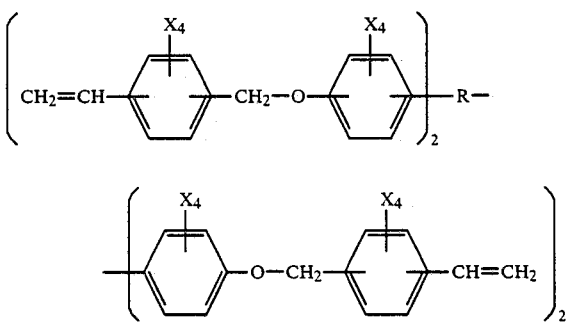

in which R is selected from the group consisting of alkyl, cycloalkyl, alkaryl and alkaryl radicals and X is independently selected from the group consisting of hydrogen and halogen atoms and (b) a compound containing at least one pendant vinyl group selected from the group consisting of styrene, o-divinylbenzene, m-divinylbenzene, p-divinylbenzene, substituted styrenes, substituted o, m, p divinylbenzenes, dismaleimides, bismaleimide-arylamine reaction products, styrene-terminated bisphenols, methyl acrylate, ethyl acrylate, propyl acrylate, methyl methacrylate, ethyl methacrylate, and propyl methacrylate.

2. The homogeneous thermosetting copolymer as set forth in claim 1 in which said alkyl radical contains from 2 to about 6 carbon atoms.

3. The homogeneous thermosetting copolymer as set forth in claim 2 in which said alkyl radical is ethylene.

4. The homogeneous thermosetting copolymer as set forth in claim 2 in which said alkyl radical is propylene.

5. The homogeneous thermosetting copolymer as set forth in claim 2 in which said alkyl radical is hexene.

6. The homogeneous thermosetting copolymer as set forth in claim 1 in which said cycloalkyl radical contains from 4 to about 12 carbon atoms.

7. The homogeneous thermosetting copolymer as set forth in claim 6 in which said cycloalkyl radical is cyclobutane.

8. The homogeneous thermosetting copolymer as set forth in claim 6 in which said cycloalkyl radical is cyclohexane.

9. The homogeneous thermosetting copolymer as set forth in claim 6 in which said cycloalkyl radical is cycloheptane.

10. The homogeneous thermosetting copolymer as set forth in claim 1 in which said alkaryl radical is p-xylene.

11. The homogeneous thermosetting copolymer as set forth in claim 1 in which said compound containing a pendant vinyl group is styrene.

12. The homogeneous thermosetting copolymer as set forth in claim 1 in which said compound containing a pendant vinyl group is divinylbenzene.

13. The homogeneous thermosetting copolymer as set forth in claim 1 in which said compound containing a pendant vinyl group is methyl methacrylate.

14. The homogeneous thermosetting copolymer as set forth in claim 1 in which said compound containing pendant vinyl group is styrene-terminated p,p'-isopropylidene diphenol.

15. The homogeneous thermosetting copolymer as set forth in claim 1 in which said compound containing a pendant vinyl group is styrene-terminated tetrabromo-substituted p,p'-isopropylidene diphenol.

16. The homogeneous thermosetting copolymer as set forth in claim 1 in which said poly(vinyl benzyl ether) of a polyphenol is styrene-terminated tetraphenol ethane and said compound containing at least one pendant vinyl group is styrene.

17. The homogeneous thermosetting copolymer as set forth in claim 1 in which said poly(vinyl benzyl ether) of a polyphenol is styrene-terminated tetraphenol ethane and said compound containing at least one pendant vinyl group is divinylbenzene.

18. The homogeneous thermosetting copolymer as set forth in claim 1 in which said poly(vinyl benzyl ether) of a polyphenol is styrene-terminated tetrakis(tetrabromophenol)ethane and said compound containing at least one pendant vinyl group is styrene-terminated p,p'-isopropylidene diphenol.

19. The homogeneous thermosetting copolymer as set forth in claim 1 in which said poly(vinyl benzyl ether) of a polyphenol is styrene-terminated tetraphenol cyclohexane and said compound containing at least one pendant vinyl group is styrene.

20. The homogeneous thermosetting copolymer as set forth in claim 1 in which said poly(vinyl benzyl ether) of a polyphenol is styrene-terminated tetraphenol propane and said compound containing at least one pendant vinyl group is styrene-terminated tetrabromo-substituted p,p'-isopropylidene diphenol.

* * * * *